Oct. 23, 1962 R. FREUNDORFER ET AL 3,060,027

PHOTOMECHANICAL METHOD OF PRODUCING PRINTING FORMS

Filed Dec. 1, 1959

INVENTORS
Roman Freundorfer
BY Hans Hoerner

Curtis, Morris, & Safford
ATTORNEYS

United States Patent Office 3,060,027

Patented Oct. 23, 1962

3,060,027

PHOTOMECHANICAL METHOD OF PRODUCING PRINTING FORMS

Roman Freundorfer, Steinerstrasse 11, and Hans Hoerner, Lipkowskystrasse 32, both of Munich, Germany Filed Dec. 1, 1959, Ser. No. 856,542
Claims priority, application Germany June 26, 1953
5 Claims. (Cl. 96—35)

This invention relates to a photomechanical method of making printing forms, and relates in particular to a photomechanical method for making printing forms from non-metallic materials. This application is a continuation-in-part of the copending application Serial No. 438,-579, filed June 22, 1954.

According to the present invention, printing forms such as printing plates or blocks, suitable for use in either relief- or gravure-printing processes, are prepared by sensitization of a polyamide blank, exposure of the sensitized blank, and development of the exposed blank by combined chemical and mechanical treatment. The process results in the production of printing forms in which the raised elements of the form have tapered sides, giving the elements a preferred conical shape, the achievement of which has heretofore been difficult in the art.

The process of the invention, which uses a chemical-mechanical developing step, is to be distinguished from prior art processes in which etching or solution processes are relied upon for developing. Such prior art processes include those in which a material such as metal is coated with a light-sensitive resist and exposed. Parts of the resist not hardened by light are next removed, and unprotected portions of the substrate material are then attacked, by etching, for example. In etching processes of this sort, undercutting of the metal portions protected by the resist easily occurs, with a subsequent destruction of the tapered side which would otherwise lend conical form to the raised printing element. The present process also differs from those in which portions of a coating of unpolymerized plastic are polymerized under the influence of light to give hardened portions, with unexposed unpolymerized portions being subsequently dissolved or washed away.

According to the present invention, a body of a polymer, copolymer, or mixed polymer, preferably a natural or synthetic polymer, copolymer or mixed polymer of a polyamide, is sensitized with a substance such as chromate or bichromate, a diazo compound or iron compounds known to affect a polymer body by hardening or tanning it on exposure to light. The sensitized body, conveniently in the form of a sheet, plate or foil, is next exposed to strong light through a suitable line- or screen-image, either positive or negative, and is then developed. In the development, the non-hardened or untanned portions of the polymer are softened by the influence of chemicals—alcohol-water mixtures, for example—and the softened, unexposed portions are removed by gentle mechanical abrasion. Those portions of the plate hardened by exposure to light do not soften in the presence of the developing solution, and are resistant to mechanical removal.

Figure 1:
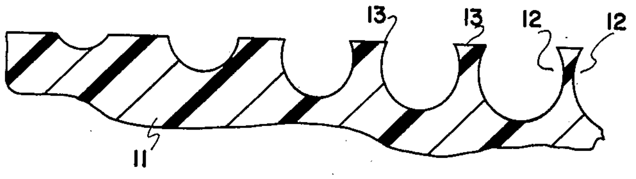
Figure 2:
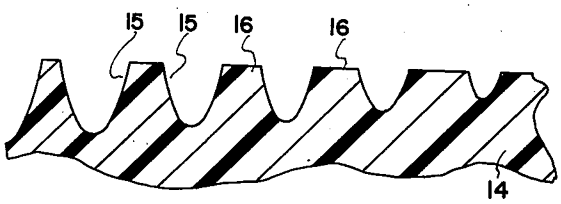
Figures 3, 4:
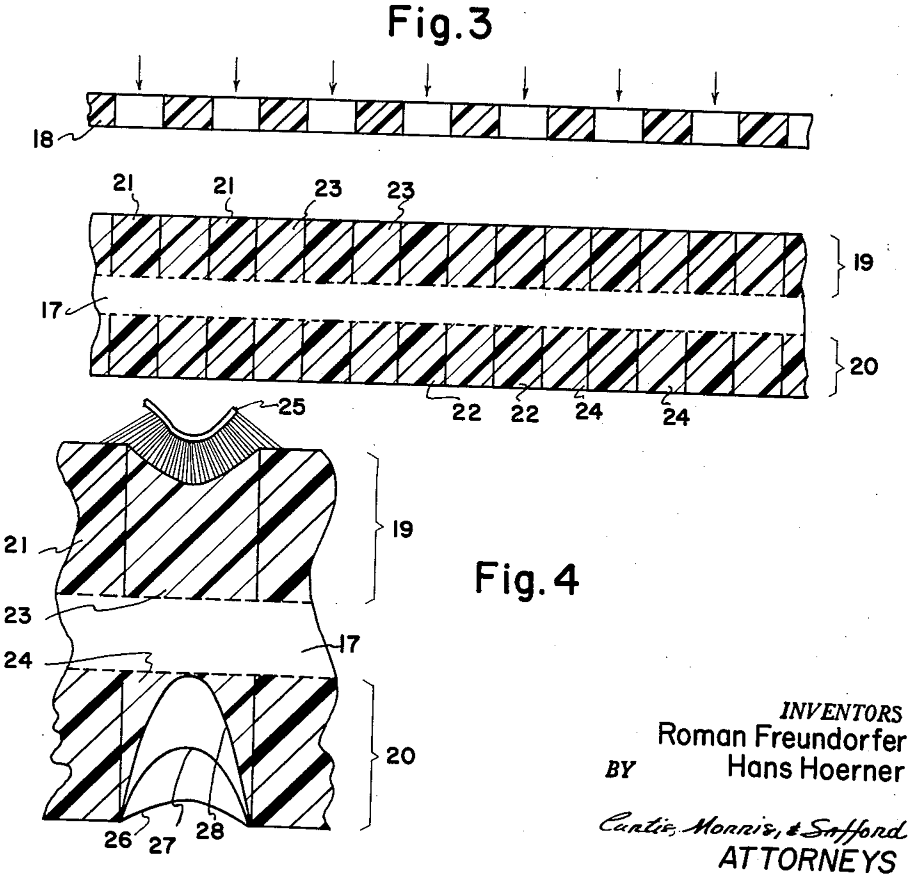

The advantageous effects obtained using the process of the invention can be more clearly understood by reference to the accompanying drawings, in which FIGURE 1 is a front elevation in section through a printing form such as those produced in the prior art by etching or solution processes, enlarged to show the detail of the etched portions; FIGURE 2 is a front elevation in section through a printing form as is produced by the present process, enlarged to show the detail of etched portions; FIGURE 3 is a front elevation in section showing schematically the exposure of a transparent sensitized printing form according to the invention; and FIGURE 4 is a front elevation in section showing schematically several stages in the development of the exposed plate of FIGURE 3, enlarged to show details thereof.

FIGURE 1 shows a printing form produced by etching, or other solution techniques. Plate 11 has in its surface bubble-shaped depressions 12, formed by solvent action which results in undercutting of raised elements 13 of the plate. The resulting "mushroom" shape of elements 13 is undesirable.

FIGURE 2 shows printing plate 14 prepared according to the present invention. Depressions 15 in plate 14 are V-shaped, giving raised elements 16 having tapered sides, which is a preferred form for such elements.

FIGURE 3 shows the exposure to light of a transparent printing plate 17 through an image 18. Pretreatment of plate 17 with sensitizers has formed sensitized layers 19 and 20 therein. Passage of light from image 18 through plate 17 causes hardening of those portions 21 and 22, in layers 19 and 20, which are exposed to light, leaving areas 23 and 24 of layers 19 and 20 unaffected.

FIGURE 4 shows various stages in the development of an exposed plate like plate 17 of FIGURE 3. A plurality of fine flexible bristles (shown in FIGURE 4 as velvet-like cloth 25) is used to abrade unhardened portions 23 of layer 19. Hardened portions 21 of layer 19 remain unaffected. Such mechanical abrasion, in the presence of a softening agent as hereinafter described, produces V-shaped depressions. The evolution of such depressions is also traced in FIGURE 4, in which lines 26, 27 and 28 are the initial, intermediate and final contours of such a V-shaped depression produced in unhardened portions 24 of layer 20. In a transparent plate 17 as shown in FIGURES 3 and 4, the production of corresponding raised elements in opposing surfaces 19 and 20 of the plate conveniently results in both a printing surface and a make-ready.

The polymer materials found particularly suitable for making printing forms according to the present invention are polyamides, and may be homopolymers or copolymers, or mixtures of homopolymers and copolymers of polyamides. The polyamides may be natural or synthetic. The synthetic materials may be polymers of one or more dicarboxylic acids with one or more diamines, or may be produced by polymerization processes using diamine salts of dicarboxylic acids with aminocarboxylic acids. Aromatic, aliphatic and araliphatic monomers can be used in the synthesis. Copolymers containing $\epsilon$-aminocaproic acid, or caprolactam, are particularly advantageous. Exemplary of the latter class of polyamide materials are 60–40 or 50–50 copolymers of hexamethylenediamine adipate and caprolactam, the proportions being by weight; copolymers of aminocaproic acid and ketopimelic acid hexanediamine containing, for example, 85 parts by weight of aminocaproic acid; a copolymer of 40 parts by weight of caprolactam, 35 parts by weight of hexamethylene-adipate, and 25 parts by weight of ketopimelic acid hexanediamine; copolymers of p-phenylenedipropionic acid and caprolactam, for example in a 9:1 ratio by weight; copolymers containing equal parts by weight of caprolactam and 4,4′-diaminodicyclohexylmethane adipate; copolymers of equal parts by weight of caprolactam, 4,4′-diaminodicyclohexyl methane, and hexamethylenediamine adipate; mixtures of these materials, etc. Natural polyamides such as zein (derived from corn), gliadin (derived from wheat), and hordein (derived from barley) show particularly good resistance to attack by benzine, chlorinated hydrocarbons and water, and can be used to particular advantage in printing forms of the type herein described.

The polyamide materials are commonly used in the form of blocks or sheets at least 0.2 mm. thick. Sheets of this thickness may require support, but thicker layers more than 1 mm. in thickness are self-supporting. The thickness of the layers can vary greatly, and is not critical to the invention. The polyamide blocks may be opaque or transparent, but if transparent have the advantage of being conveniently processable to give a make-ready on the reverse or non-printing side of the block.

The polyamide blocks are sensitized using materials known to the printing arts. Best results have been obtained using a solution of 25–75 percent by volume of acetone, the balance water, in which the sensitizing agent, preferably a bichromate salt, is dissolved. The water serves to dissolve the salt, while the acetone swells the polymer, making it diffusion receptive, and speeds penetration of the sensitizer into the polymer body. An amount of hardener between 0.5 or 1 percent to 10 percent, preferably 3 percent, by weight of the water-acetone solution is preferably employed. The solution is conveniently applied by brushing or spraying, particularly if a backed polyamide body is used, or may be applied simply by immersing the entire polyamide body into the solution. The body is usually treated with sensitizer solution for a minimum of 1 minute, preferably for 2–3 minutes. The sensitized blank may conveniently be dried at a temperature of about 50° C. These operations are carried out under diffuse light insufficient to expose the plate.

The dried plate is then exposed to the image to be copied, which may be a positive or negative line- or screen-image, by techniques known to the art using, e.g., a carbon arc or other strong light source. No movement of the light source to give angularly incident rays is required, as is the case for some processes which depend on such incident rays to expose laterally disposed sub-surface portions of a transparent polymerizable coating.

If transparent polyamide blocks are used, hardening can occur in all portions of the block previously treated with sensitizing solution. In particular, the reverse or non-printing side may be hardened in a pattern corresponding with the image. The hardening effect on the reverse side may be less pronounced than on that face directly exposed, because of the diminished intensity of the light after traversal of the block. However, by development of this image on the reverse side of the block, a make-ready is quickly and conveniently formed.

Development of the exposed plate follows by a process in which both chemical and mechanical effects are involved. The plate is treated with a developing solution which softens, and may swell, but does not dissolve, the unexposed polyamide. The plate is mechanically abraded to remove the softened portions. Although alternate steps of softening and abrading can be employed, generally with repetition, the development is most conveniently done by rubbing the exposed plate with a material, such as plush or sheared velvet, having a plurality of fine, flexible sharp bristles moistened with the developing solution. A foam rubber pad, covered with a moistened plush or velvet fabric, has been used with particular success.

As developers, solutions in which the polyamides soften, but do not dissolve, are used. Among these, aqueous solutions of water-miscible monohydric and polyhydric alcohols, particularly of the miscible monohydric lower alcohols (1 to 4 carbon atoms) are preferred. The solutions contain a minimum of about 2 percent by volume of water, and preferably contain about 4 percent by volume of water. For still faster development, solutions having 6–8 percent by volume of water can be employed. It is emphasized that these solutions do not dissolve unexposed polyamide polymer of the printing forms, as has been proved by allowing the forms to soak in the solutions for long periods without significant removal of unexposed polymer.

Thus, a mechanical brushing away of softened polymer is necessary. However, brushing with pure alcohols will not remove significant amounts of unexposed polymer, and only aqueous solutions of the alcohols are effective. A water content in the alcohols greater than about 10 percent by volume brings about very rapid development. Where high definition is not critical, such solutions can be used to advantage, and the make-ready formed on the reverse side of exposed transparent polyamide printing forms is conveniently developed by rubbing the reverse side of the forms with an alcohol solution containing 15 percent–20 percent by volume of water. Still higher water contents, greater than about 30 percent, may cause significant solution of the polyamides, and are to be avoided. However, at water concentrations higher than about 50 percent by volume, the solubility of the polyamides in the solutions falls sharply.

In the developers, acid may be substituted for water in whole or in part. As the pH of such solutions decreases, the amount of water required to yield a given softening or dissolving action is also decreased.

Although mixtures of lower monohydric alcohols, particularly n-propanol, and water or acid are preferred developing agents, other materials can be used. For example miscible polyhydric alcohol mixtures such as a mixture of 85 percent by volume of ethylene glycol and 15 percent by volume of aqueous HCl (density 1.15, 10 percent in water), or a mixture of 80 percent by volume of diacetone alcohol and 20 percent by volume of aqueous HCl (density 1.15, 10 percent in water) are suitable developers. In the same way, lower and higher alcohols and glycols can be mixed with materials such as ethylenechlorohydrin, phenol, etc. to form dilute developing solutions. When natural polyamides such as zein are used to make printing blocks, highly alkaline aqueous solutions, e.g. of pH 10 or more, can be used as developing agents with or without alcohol additions.

By varying the strength of the developing solution, the pressure used in the mechanical abrading process, and the developing time, the operator has several means of controlling the developing process. In general, using the preferred dilute aqueous alcoholic developers, and developing times of from 30 seconds to 2 minutes, the pressures used for abrading the printing blocks will vary from 2 grams per square centimeter to 5 grams per square centimeter.

The following examples illustrate the methods of the invention.

*Example 1*

A transparent polyamide plate 1.75 mm. thick and comprised of a copolymer of equal parts by weight of 4,4′-diaminodicyclohexylmethane, hexamethylenediamine adipate and caprolactam was submerged for 2½ minutes in a solution of 3 grams of ammonium bichromate dissolved in a mixture of 50 cubic centimeters of water and 50 cubic centimeters of acetone, whereby the solution diffused into surface portions of the plate and sensitized it to light. After removing traces of the sensitizing solution from the plate using absorbent cotton, the plate was exposed for 2½ minutes in vacuum, through a photographic screen negative, to the light of a 45 ampere carbon arc lamp. The distance of the plate from the light source was 75 centimeters. The reverse side of the plate, i.e. the side which had not been in contact with the negative, was then adhered to a rubbing block using a conventional adhesive tape having two adhesive sides. The rubbing block comprised a plastic block with a movable hand grip. With the aid of the rubbing block, the polyamide plate was now rubbed against a surface of stretched velvet which had been moistened with a developing agent comprising 97 parts by volume of n-propanol and 3 parts by volume of water. At a pressure of about 2.5 grams per cubic centimeter, those parts of the plate which had not been exposed to light were removed within 1 minute, and the resulting plate was suitable for use in relief printing.

In case a make-ready is desired, the developed plate is reversed on the rubbing block to expose its reverse side, and this side similarly is rubbed against the velvet surface moistened with developer to produce a relief on the reverse face.

*Example 2*

A polyamide sheet comprising a 0.75 millimeter thick layer of zein on a backing of 1 millimeter thick aluminum was dipped into a sensitizing bath like that in Example 1 for 2½ minutes. After removal of the excess sensitizing solution with cotton, the plate was exposed through a photographic line-negative to a 40 watt actinic source for a period of 6 minutes at a distance of 10 centimeters. After fastening to a rubbing block as described in Example 1 and rubbing for 6 minutes against a velvet surface moistened with a developing solution consisting of 60 parts by volume of n-propanol and 40 parts of water, unexposed portions of the polyamide were removed, and a relief printing plate resulted.

*Example 3*

A polyamide sheet 0.2 mm. thick and comprising a copolymer of equal parts by weight of 4,4′-diaminodicyclohexylmethane, hexamethylenediamine adipate, and caprolactam, mounted on a carrier plate of aluminum 0.1 millimeter thick, was sensitized using the process and solution of Example 1. After drying, the polyamide was exposed to the arc of a 45 watt arc lamp at a distance of 1 meter for 45 seconds through a photographic half-tone positive. The half-tone positive was then replaced by an ordinary gravure raster, and the plate was again exposed to a 45 ampere arc lamp for 45 seconds, this time at a distance of 30 centimeters for 45 seconds. The plate was then developed by brushing a plush tampon moistened in a developing agent comprising a dilute solution of water in alcohol over the illuminated side of the plate. Small basin-like depressions, limited in their dimensions by the raster employed and having a depth more or less inversely proportional to the intensity of light reaching them through the continuous-tone positive, were formed in the surface of the plate, which was suitable for gravure printing.

Although specific embodiments have been herein shown and described, they are illustrative, and are not to be taken as limiting the scope and spirit of the invention.

We claim:

1. A photomechanical method for preparing printing plates having conical printing elements free of undercutting in the base portions thereof which comprises light-sensitizing a body of polyamide condensation polymer by contacting said body with a solution of a light sensitive hardening agent for said polymer, exposing the sensitized body to a light image, whereby those portions of the polyamide body exposed to light are hardened, and subsequently developing said polyamide body by partially removing unhardened portions thereof to leave conical printing elements comprising said exposed and hardened portions and unremoved unhardened portions, said partial removal being effected by repeatedly softening and abrading unhardened surface portions of the polyamide body with a plurality of fine, flexible bristles moistened with a softening agent for said polyamide, said softening agent comprising water and a water-miscible organic liquid, said abrading being more pronounced in those portions of the unhardened polyamide remote from the exposed and hardened portions thereof than in those portions of the unhardened polyamide adjoining said hardened portions.

2 A method according to claim 1 wherein said softening agent comprises a dilute solution of water in a water-miscible alcohol.

3. A method according to claim 1 wherein said softening and abrading is effected with a velvet-like fabric moistened with said softening agent.

4. A photomechanical method for preparing printing plates having conical printing elements free of undercutting in the base portions thereof, said plates also having an opposing make-ready, which comprises light-sensitizing a transparent body of polyamide condensation polymer by contacting each of two opposing surfaces of said body with a solution of a light sensitive hardening agent for said polymer, directly exposing one of the opposing surfaces of the sensitized body to a light image of sufficient intensity to penetrate the body and expose the second of said opposing surfaces, whereby those portions of both opposing surfaces of the body which are exposed to light are hardened, and subsequently developing both of said opposing surfaces of the polyamide body by partially removing unhardened portions thereof to leave conical printing elements comprising said exposed and hardened portions and unremoved unhardened portions on the directly exposed surface and a make-ready on the opposing surface, said partial removal being effected by softening unhardened portions of the polyamide body with a softening agent for said polyamide, said softening agent comprising water and a water-miscible organic liquid, and then removing softened portions by abrading with a plurality of fine, flexible bristles.

5. A method according to claim 4, wherein said softening agent comprises a dilute solution of water in a water-miscible alcohol.

References Cited in the file of this patent

UNITED STATES PATENTS

| | | |
|---|---|---|
| 2,299,839 | McQueen | Oct. 27, 1942 |
| 2,365,416 | Kuhne | Dec. 9, 1944 |
| 2,388,880 | Stitt | Nov. 13, 1945 |
| 2,484,529 | Roedel | Oct. 11, 1949 |
| 2,760,863 | Plambeck | Aug. 28, 1956 |
| 2,772,160 | Hepher | Nov. 27, 1956 |
| 2,892,712 | Plambeck | June 30, 1959 |
| 2,951,305 | Seymour | Sept. 6, 1960 |
| 2,997,391 | Murray et al. | Aug. 22, 1961 |